(12) United States Patent
Taguchi

(10) Patent No.: US 10,381,245 B2
(45) Date of Patent: Aug. 13, 2019

(54) MANUFACTURING METHOD FOR SEMICONDUCTOR DEVICE

(71) Applicant: SII Semiconductor Corporation, Chiba-shi, Chiba (JP)

(72) Inventor: Yasuhiro Taguchi, Chiba (JP)

(73) Assignee: ABLIC INC., Chiba (JP)

(*) Notice: Subject to any disclaimer, the term of this patent is extended or adjusted under 35 U.S.C. 154(b) by 117 days.

(21) Appl. No.: 15/695,190

(22) Filed: Sep. 5, 2017

(65) Prior Publication Data

US 2018/0068869 A1    Mar. 8, 2018

(30) Foreign Application Priority Data

Sep. 6, 2016 (JP) ................. 2016-173754
Jul. 24, 2017 (JP) ................. 2017-142522

(51) Int. Cl.
*H01L 21/48* (2006.01)
*H01L 21/56* (2006.01)
*H01L 21/78* (2006.01)
*H01L 23/31* (2006.01)
*H01L 23/495* (2006.01)
*H01L 23/00* (2006.01)

(52) U.S. Cl.
CPC ........ *H01L 21/4842* (2013.01); *H01L 21/561* (2013.01); *H01L 21/565* (2013.01); *H01L 21/78* (2013.01); *H01L 23/3114* (2013.01); *H01L 23/49513* (2013.01); *H01L 23/49541* (2013.01); *H01L 23/49562* (2013.01); *H01L 24/83* (2013.01); *H01L 24/97* (2013.01); *H01L 21/56* (2013.01); *H01L 23/3107* (2013.01); *H01L 23/49548* (2013.01); *H01L 24/32* (2013.01); *H01L 2224/32245* (2013.01)

(58) Field of Classification Search
CPC ................................. H01L 21/4842
See application file for complete search history.

(56) References Cited

U.S. PATENT DOCUMENTS

| 2002/0121684 | A1 | 9/2002 | Kobayakawa | |
| 2003/0164535 | A1* | 9/2003 | Inatsugu | H01L 21/4842 257/666 |
| 2008/0191328 | A1* | 8/2008 | Kobayakawa | H01L 23/49503 257/676 |
| 2014/0374890 | A1* | 12/2014 | Yamashita | H01L 23/49575 257/670 |

FOREIGN PATENT DOCUMENTS

JP    2002-208664 A    7/2002

* cited by examiner

Primary Examiner — Peniel M Gumedzoe
Assistant Examiner — Christopher A Johnson
(74) Attorney, Agent, or Firm — Brinks Gilson & Lione

(57) ABSTRACT

Provided is a manufacturing method for a semiconductor device using stamping press working which is capable of securing an island having substantially the same size as that of a related art even when a lead frame thickness is increased. A portion between the island and the inner lead is punched with a punch having a width of equal to or larger than a minimum required plate thickness for stamping press working. A periphery of the island is squeezed from an island back surface. A gap between the island and the inner lead is set to be smaller than a thickness of the lead frame, and at the same time, the thickness of the lead frame in the periphery of the island is set smaller than an original plate thickness of the lead frame, thereby obtaining a required area of the island.

4 Claims, 11 Drawing Sheets

SQUEEZING

PRESS WORKING

SQUEEZING

AFTER SQUEEZING

MANUFACTURING METHOD FOR SEMICONDUCTOR DEVICE

RELATED APPLICATIONS

This application claims priority under 35 U.S.C. § 119 to Japanese Patent Applications No. 2016-173754 filed on. Sep. 6, 2016 and No. 2017-142522 filed Jul. 24, 2017, the entire content of which are hereby incorporated by reference.

BACKGROUND OF THE INVENTION

1. Field of the Invention

The present invention relates to a manufacturing method for a semiconductor device contained in a resin-sealed semiconductor package, in particular, to a manufacturing method for a semiconductor device contained in a resin-sealed semiconductor package using a lead frame manufactured through stamping press working.

2. Description of the Related Art

Along with downsizing of mobile electronic equipment in recent years, a semiconductor package also needs to be downsized and thinned for use in such mobile electronic equipment. In the semiconductor package an encapsulated semiconductor element needs to be sealed with resin in order to protect from an environment.

Downsizing and thinning of the semiconductor package are necessary. But employment of a thick lead frame for a semiconductor package is also necessary in some application of high voltage and high current.

As a result, there has been manufactured a package in which a resin seal has a small thickness so as to suppress the thickness after sealing the semiconductor element while a lead frame having a large thickness with respect to the thickness of the resin seal is adopted. For example, there has been manufactured a pin-insertion type semiconductor package in which the resin seal has a thickness of 1.5 mm and the lead frame has a thickness of equal to or more than 0.4 mm.

Alloy 194 or other copper alloy is generally used for a material of the lead frame. Further, the lead frame is processed through etching or through press working with use of a stamping press die, and there has been proposed an invention of minimizing a gap between an island and an inner lead through etching process (see Japanese Patent Application Laid-open No. 2002-208664). The lead frame manufactured through etching process does not need preparation of a die unlike the case of the stamping press working. However, the etched lead frame requires masking with a dry film using a photoresist at the time of etching process. Since a dry film which has been used once cannot be reused, and is disposed, continuous preparation of a dry film is needed during continuous manufacturing of a lead frame. Further, since the etching process involves use of chemicals, the etching process is less accurate in obtaining a desired shape as compared to the press working with use of the stamping press die.

When the lead frame is processed with the stamping press die, the lead frame is punched with a cutter called punch. As a material of the punch, a superhard material is generally used. A characteristic of the superhard material is not only hard but also brittle. In order to avoid buckling caused by the brittleness of the superhard material, the punch for punching needs to have a width which can secure strength with respect to the lead frame to be processed. With regard to the width of the punch for punching, a minimum punching width for processing is thus determined based on a plate thickness of the lead frame. In general, when the stamping press die is used to punch a shape, the stamping press die has a punching width of equal to or larger than the plate thickness of the lead frame so as to secure the punch strength. As a result, the punch for punching a portion between the inner lead and the island also needs a width of equal to or larger than the plate thickness, with the result that a gap of at least equal to or larger than the plate thickness is needed.

Use of a thick lead frame needs reduction of the inner lead or the island in order to secure a gap of equal to or larger than the plate thickness between the inner lead and the island. The inner lead requires at least a wire connection region to which the semiconductor element is electrically connected after mounting. Further, in the semiconductor package which provides a high current, a wire electrically connecting the semiconductor element and the inner lead to each other should have a large diameter. However, reduction of the inner lead reduces the wire connection region, with the result that a target wire cannot be connected. Finally, it is required to reduce an island size. The semiconductor element on the island is generally fixed to the island with a die attach material. However, in order to secure a fixing strength between the semiconductor element and the island, the die attach material should spread to extend over a side surface of the semiconductor element to form a fillet. Accordingly, with respect to the island size, the mountable semiconductor element should have a size which enables formation of the fillet of the die attach material. That is, reduction in island size requires reduction in size of the mountable semiconductor element.

In general, the chip size of a semiconductor product increases along with addition of functions and enlargement of controllable current. As a result, reduction in island size requires reduction in size of the mountable semiconductor element, with the result that there arises a possibility that a semiconductor element having a target function cannot be mountable.

As described above, use of a thick lead frame is needed for a semiconductor package in which a high voltage and a high current should be handled. However, when the thickness of the lead frame is equal to or larger than one-fourth of the thickness of the resin seal, a flow of resin may be hindered. Such hindrance of the flow of resin may cause non-filling, in which resin is prevented from reaching a terminal end of a product, or generation of internal void, in which air is taken into the product during curing of resin, leading to degradation of reliability of the product.

SUMMARY OF THE INVENTION

Hence the present invention has an object to provide a manufacturing method for a semiconductor device involving stamping press working, which is capable of securing an island having substantially the same size as that of the related art even when a lead frame is increased in thickness.

According to one embodiment of the present invention, first, a portion between the island and the inner lead is punched with use of a punch having a width of equal to or larger than a minimum required plate thickness for stamping press working. After that, a periphery of the island is squeezed from an island back surface. A gap between the island and the inner lead is set to be smaller than the plate thickness of the lead frame, and at the same time, the thickness of the lead frame in the periphery of the island is set smaller than an original plate thickness of the lead frame, thereby increasing a surface of the island and obtaining a required area of the island.

The island back surface is squeezed to increase an island size, thereby alleviating size limitation for a mountable semiconductor element. Further, since an inflow passage at the time of performing resin sealing is increased by squeezing the island back surface, hindrance by the lead frame at the time of filling resin is reduced, leading to elimination of non-filling and internal void.

DETAILED DESCRIPTION OF THE PREFERRED EMBODIMENTS

Now, description is made of embodiments of the present invention with reference to the drawings. First, description is made of a case of a pin-insertion type semiconductor package.

Figure 1:
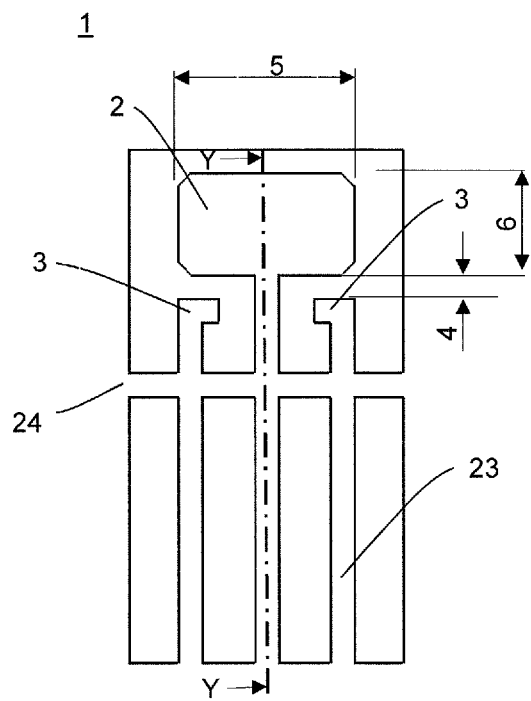
FIG. 1 is a front plan view for illustrating a shape of a lead frame of a first embodiment of the present invention after being subjected to stamping press punching.
Figure 2:
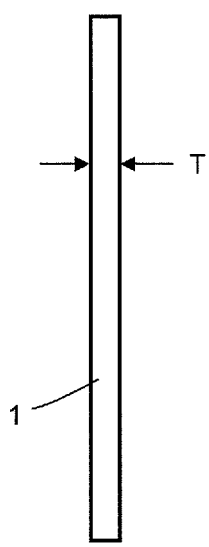
FIG. 2 is a side view for illustrating the shape of the lead frame of the first embodiment of the present invention after being subjected to the stamping press punching.

FIG. 1 is a front plan view for illustrating a shape of a lead frame of a first embodiment of the present invention after being subjected to stamping press working. FIG. 2 is a side view for illustrating a thickness of the lead frame of the embodiment of the present invention, and is a sectional view taken along the cutting line Y-Y of FIG. 1.

First, a prepared lead frame material is subjected to punching with use of a stamping press die to form a lead frame 1 having an island 2, inner leads 3, and outer leads 23. The island 2 receives a semiconductor element mounted thereto. The inner leads 3 are electrically connected by wires to electrodes of the semiconductor element. The outer leads 23 are continuous with the inner leads 3. Between the island and each of the inner leads, there is formed a gap 4 having a size substantially equal to a plate thickness T of the lead frame illustrated in FIG. 2. The leads including the inner leads 3 and the outer leads 23 are fixed by a tie bar 24. In FIG. 1, only the lead frame for one semiconductor product is illustrated. During a course of manufacture of the lead frame, lead frames including the lead frame illustrated in FIG. 1 are repeatedly formed in two dimensions including longitudinal and horizontal directions.

The gap 4 is punched with use of a punch (cutter) in a stamping press die. However, when the strength of the punch is insufficient, there is a possibility of causing breakage of the punch due to resistance at the time of punching the lead frame. Since the broken cutter may disperse in the die and there is a possibility of causing breakage of other portions in the die, in general, a width of equal to or larger than the plate thickness of the lead frame is secured to maintain the punch strength.

Hence a width substantially equal to or larger than the plate thickness T of the lead frame is required between the island 2 and each of the inner leads 3 when punching is performed with the stamping press die.

With regard to sizes 5 and 6 of the island 2 (X direction island size 5 and Y direction island size 6), in order to secure the punch strength of the stamping press die for punching, it is required to secure a width of equal to or larger than the plate thickness of the lead frame at the gap 4 between the island 2 and each of the inner leads 3, and the sizes 5 and 6 of the island 2 cannot be increased. Further, the inner leads 3 are wire connection regions which are electrically connected to the semiconductor element after mounting on the island. The wire connection region needs to be increased in area in proportional to increase in wire diameter. Reduction of the region may limit a diameter of a wire to be connected. Further, reduction of the inner lead limits the target number of connected wires in a case in which a plurality of wires are used in the semiconductor package for handling a large current, with the result that there is a possibility that the target performance of the semiconductor device cannot be achieved. Hence forcible wire connection through reduction of the inner lead is not performed.

Figure 3:
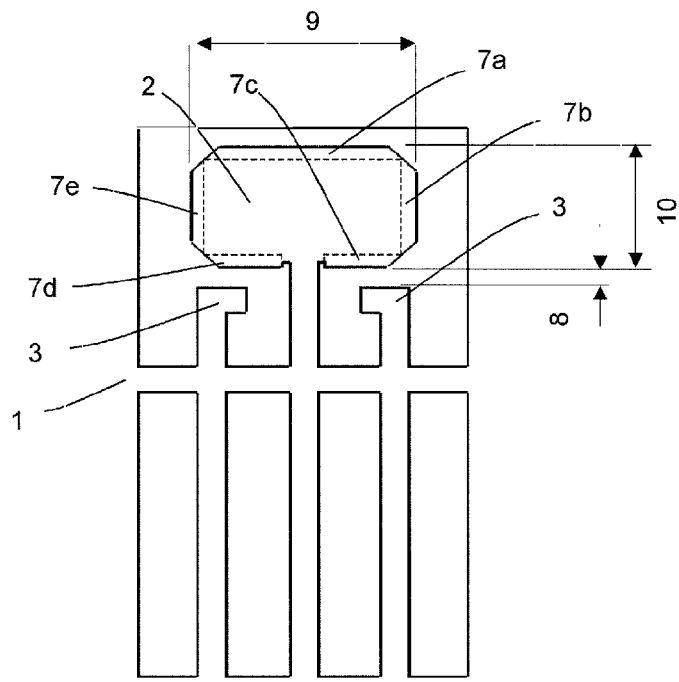
FIG. 3 is a front plan view for illustrating a shape of the lead frame of the first embodiment of the present invention after being subjected to island back surface squeezing.

FIG. 3 is a front plan view of the lead frame of the embodiment of the present invention in which squeezing is performed along a periphery of the back surface of the island 2 after stamping press punching to form squeezed portions 7a, 7b, 7c, 7d, and 7e. A gap 8 between the island 2 and each of the inner leads 3 can be set equal to or smaller than a half of the gap 4 illustrated in FIG. 1 by forming the squeezed portions 7c and 7d in the island back surface.

Further, when the squeezed portions 7a, 7c, and 7d are formed, a Y direction island size 10 can be increased with respect to the Y direction island size 6 of FIG. 1. With this structure, a size Y of the mountable semiconductor element can be increased.

Further, when the squeezed portions 7b and 7e are formed, an X direction island size 9 can be increased with respect to the X direction island size 5 of FIG. 1. The squeezed portions 7b and 7e can be increased not only by squeezing but also by simply changing the punching shape with the stamping press working. However, in consideration of the influence on filling of resin, it is preferred that the squeezing be performed. Description is made later.

Figure 4:
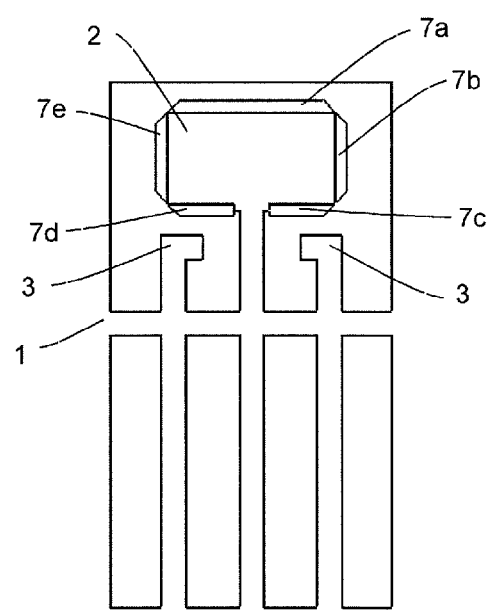
FIG. 4 is a back view for illustrating the shape of the lead frame of the first embodiment of the present invention after being subjected to the island back surface squeezing.

FIG. 4 is a back view for illustrating an embodiment in which the squeezing of the present invention is performed on the island back surface. The squeezed portions 7a, 7b, 7c, 7d, and 7e are formed in the back surface of the island 2. After the squeezing, the semiconductor element is mounted by bonding the semiconductor element to the island with use of the die attach material, and an electrode provided to a front surface of the semiconductor element and the inner lead are electrically connected to each other with a wire mainly containing gold or aluminum.

Figure 5A:
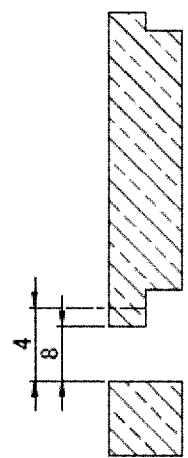
FIG. 5A, FIG. 5B, and FIG. 5C are views for illustrating squeezing.
Figure 5B:
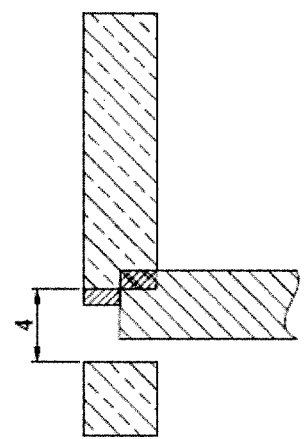
Figure 5C:
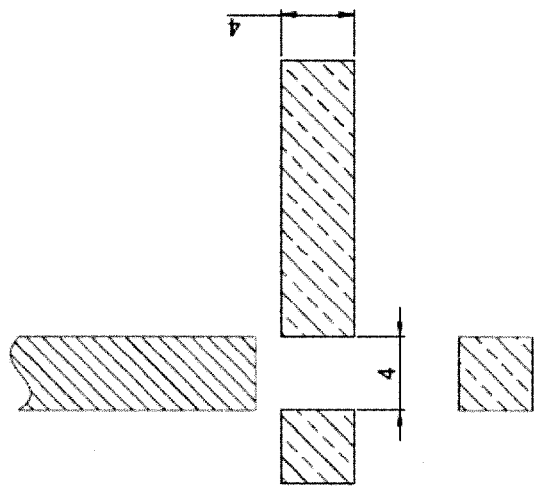

FIG. 5A to FIG. 5C are views for illustrating the squeezing. As illustrated in FIG. 5A, after stamping press working, the gap 4 between the island 2 and each of the inner leads 3 has a size which is at least equal to the plate thickness T of the lead frame. Thus, as illustrated in FIG. 5B, in order to perform the squeezing, a distal end of the punch is pressed along an edge of the island, and the lead frame material provided at the location of being held in abutment against the punch is moved toward the front surface of the lead frame. Although illustration is omitted, the moved lead frame material is plastically deformed along the front surface since the lead frame is fixed to a flat surface with the front surface thereof being oriented downward. As a result, as shown in FIG. 5C for illustration after the squeezing, a squeezed region which extends in a form of an eave is formed in the periphery of the island front surface. With this action, the gap 4 between the island 2 and each of the inner leads 3 is reduced to newly form the gap 8, thereby being capable of increasing an area of the island.

Figure 6:
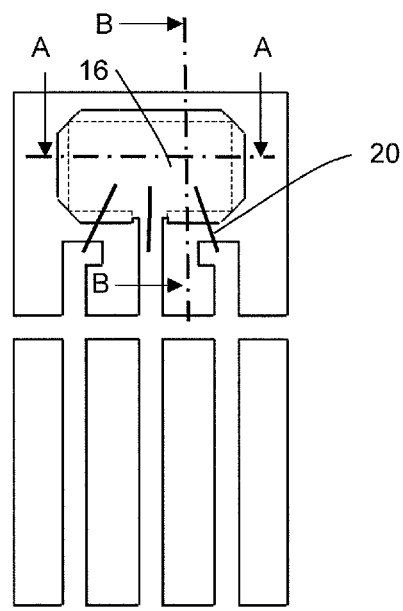
FIG. 6 is a cross sectional view for illustrating an example of the island back surface squeezing for the lead frame of the first embodiment of the present invention.

FIG. 6 is a cross sectional view of a squeezed shape of the island back surface of the present invention. FIG. 6 is an illustration in which a semiconductor element 16 is mounted to the front surface of the island 2. Wires 20 connect the electrode (not shown) of the semiconductor element 16 and each of the inner leads 3 to each other.

Figure 7:
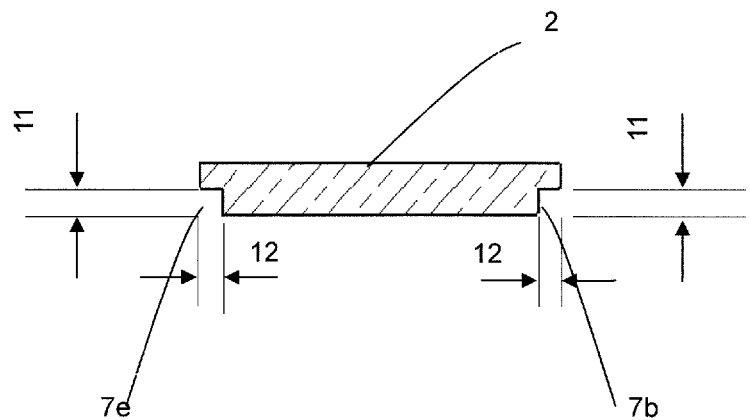
FIG. 7 is a sectional view taken along the line A-A of FIG. 6.

FIG. 7 is a detailed sectional view taken along the cutting line A-A of FIG. 6. The squeezed portions 7b and 7e are each formed in the back surface of the island 2 with a depth 11 and a width 12. The semiconductor element 16 is omitted.

Figure 8:
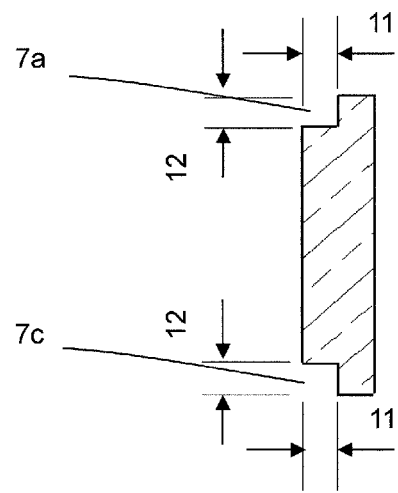
FIG. 8 is a sectional view taken along the line B-B of FIG. 6.

FIG. 8 is a detailed sectional view taken along the cutting line B-B of FIG. 6. The squeezed portions 7a and 7c are each formed in the back surface of the island 2 with the depth 11 and the width 12. The squeeze depth 11 of equal to or larger than a half of the plate thickness can be processed without any problem. When the squeeze depth is set larger, the island size can further be increased. The squeeze width 12 can be set up to equal to the plate thickness T of the lead frame.

Figure 9:
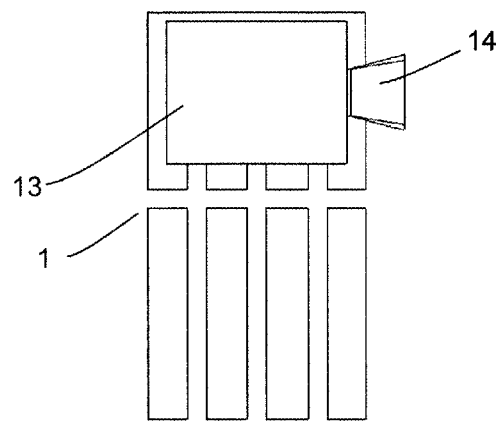
FIG. 9 is a front plan view illustration after resin sealing with use of the lead frame of the first embodiment of the present invention.

FIG. 9 is a front plan view for illustrating a semiconductor package of the first embodiment of the present invention after filling resin. A sealing resin 13 is filled onto the lead frame through a resin injection port (gate) 14. In the embodiment of FIG. 9, the resin injection port is provided on the +X side. However, the resin injection port may be provided at any position of a resin body.

Figure 10:
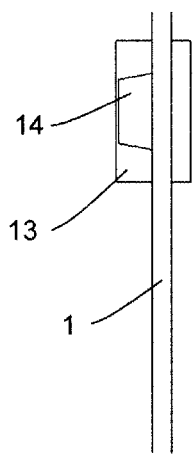
FIG. 10 is a side view illustration after resin sealing with use of the lead frame of the first embodiment of the present invention.

FIG. 10 is a side view for illustrating a semiconductor package of the first embodiment of the present invention after filling resin. The sealing resin 13 is formed on the front surface side and the back surface side with a required thickness so as to seal the island and the inner leads connected to the lead frame 1, the semiconductor element fixed to the island with the die attach material, and the wires connecting the semiconductor element and the inner leads.

Figure 11:
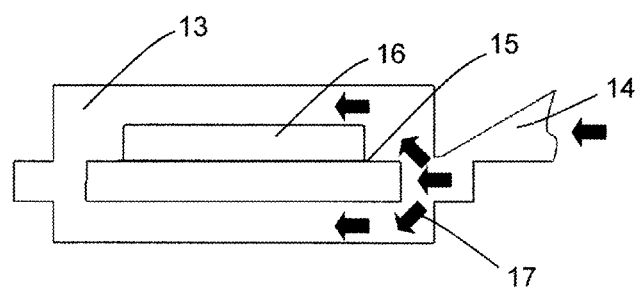
FIG. 11 is a sectional view for illustrating a resin inflow passage at the time of performing resin sealing in a related-art lead frame.

FIG. 11 is a sectional view for illustrating a filling of the resin in the case of using the lead frame which is not subjected to the island back surface squeezing after punching with the stamping press working of the present invention for comparison. The sealing resin 13 is filled through the resin injection port 14 via a resin inflow passage 17. In a case in which the plate thickness of the lead frame is relatively large with respect to the thickness of the sealing resin, for example, is equal to or larger than one-fourth of the thickness of the sealing resin, when the sealing resin 13 flows into the resin body 13 through the resin injection port 14, there is a possibility that the lead frame 1 may hinder the flow of the resin, thereby causing insufficient filling of resin.

Figure 12:
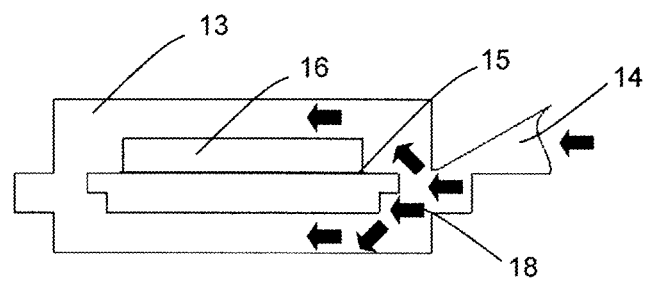
FIG. 12 is a sectional view for illustrating a resin inflow passage at the time of performing the resin sealing for the lead frame of the first embodiment of the present invention.

FIG. 12 is a sectional view for illustrating a filling of the resin in which the lead frame of the first embodiment of the present invention is used. The resin is filled through the resin injection port 14 via a resin inflow passage 18. The thickness of the end portion of the island 15 is smaller as compared to the filling of resin in which the lead frame is not subjected to the processing according to the first embodiment of the present invention shown in FIG. 10. The filling passage for the resin at the end portion of the island is thus secured, thereby reducing non-filling of the resin and the generation of the internal void caused by air remaining in the sealing resin 13.

Figure 13:
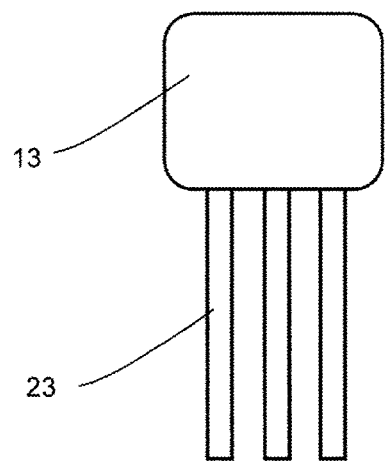
FIG. 13 is a view for illustrating an individual semiconductor device formed after cutting from the lead frame and separated into an individual piece.

FIG. 13 is an illustration of a semiconductor device which is cut from the lead frame after resin sealing so as to separate into an individual piece. In the this embodiment, the semiconductor device is sealed with resin in the semiconductor package having a lead shape in which a portion of the outer leads 23 protrudes in parallel in one direction from the sealing resin 13.

In the above, description is made of the case of the pin-insertion type semiconductor package being the embodiment of the present invention. The embodiment of the present invention is not limited to the case of the pin-insertion type semiconductor package. Next, description is made of an embodiment in a case of a semiconductor package of a gull-wing type in which a pin is extended for a relatively long distance from the side surface of the semiconductor package to an outside.

Figure 14:
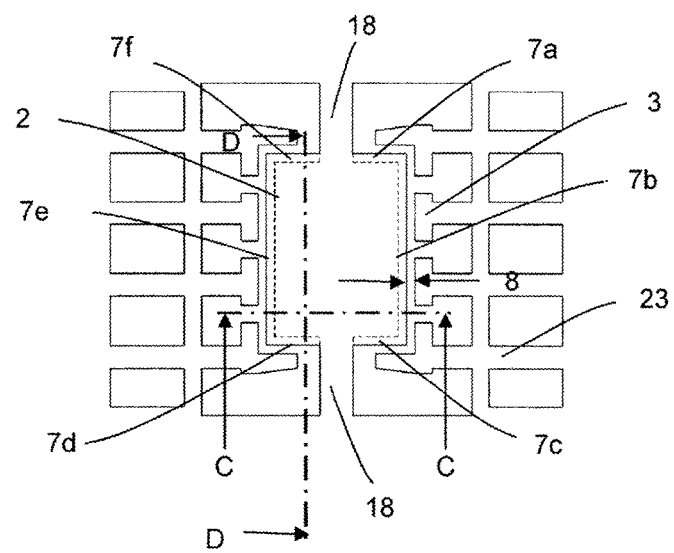
FIG. 14 is a front plan view for illustrating a shape of a lead frame of a second embodiment of the present invention after being subjected to island back surface squeezing.

FIG. 14 is a front plan view of a lead frame which is used for the semiconductor package of the gull-wing type being the second embodiment of the present invention. After the stamping press punching, squeezing is performed along the periphery of the back surface of the island 2 so that the squeezed portions 7a, 7b, 7c, 7d, 7e, and 7f are formed. The gap 8 between the island 2 and each of the inner leads 3 can be set smaller than the original gap formed by the stamping press punching by providing the squeezed portions 7a to 7f in the island back surface. Depending on the size of the original gap, the gap 8 can be set equal to or smaller than one half of the original gap by squeezing. The island is hence expanded in the longitudinal and horizontal directions.

Since a suspension lead 18 for supporting the island 2 is extended and arranged from both ends of the island 2, which correspond to upper and lower sides in FIG. 14, the squeezed portions cannot be provided in the back surface at those portions. The squeezed portions 7a and 7f and the squeezed portions 7c and 7d are divided by the suspension lead 18. The outer leads 23 which are extended outward from the semiconductor package are continuous with the inner leads 3.

Figure 15:
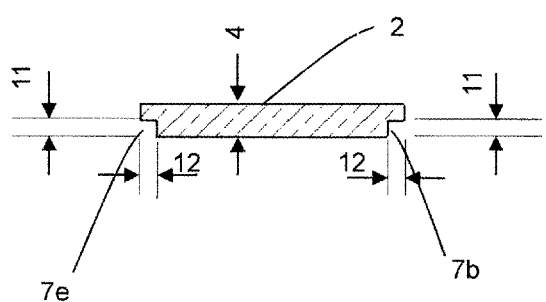
FIG. 15 is a sectional view taken along the line C-C of FIG. 14.

FIG. 15 is a detailed sectional view taken along the cutting line C-C of FIG. 14. The squeezed portions 7b and 7e are each formed in the back surface of the island 2 with the depth 11 and the width 12. The squeeze depth 11 being equal to or larger than a half of the plate thickness can be processed without any problem. When the squeeze depth is set larger, the island size can further be increased. The squeeze width 12 can be set up to equal to the plate thickness T of the lead frame.

Figure 16:
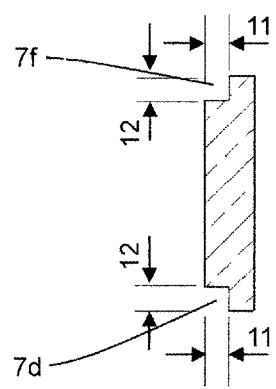
FIG. 16 is a sectional view taken along the line D-D of FIG. 14.

FIG. 16 is a detailed sectional view taken along the cutting line D-D of FIG. 14. The squeezed portions 7d and 7f are each formed in the back surface of the island 2 with the depth 11 and the width 12. The squeeze depth 11 of equal to or larger than a half of the plate thickness can be processed without any problem. When the squeeze depth is set larger, the island size can further be increased. The squeeze width 12 can be set up to equal to the plate thickness T of the lead frame.

The suspension lead 18 is cut after the island 2, the inner leads 3, the semiconductor element (not shown) mounted on the island 2, and the wires (not shown) connecting the semiconductor element and the inner leads are sealed with the sealing resin. An end surface of the suspension lead 18 after cutting is hence exposed from the sealing resin.

Figure 17:
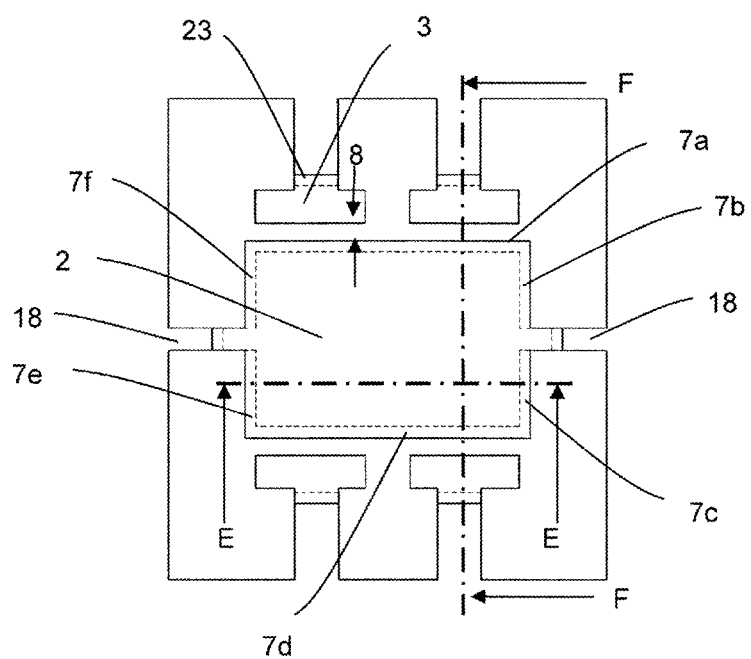
FIG. 17 is a front plan view for illustrating a shape of a lead frame of a third embodiment of the present invention after being subjected to island back surface squeezing.

FIG. 17 is a front plan view of a lead frame which is used for a non-lead type semiconductor package being a third embodiment of the present invention. After the stamping press punching, squeezing is performed along the periphery of the back surface of the island 2 so that the squeezed portions 7a, 7b, 7c, 7d, 7e, and 7f are formed. The gap 8 between the island 2 and each of the inner leads 3 can be set smaller than the original gap formed by the stamping press punching by providing the squeezed portions 7a to 7f in the island back surface. Since the gap 8 can be set equal to or smaller than one half of the original gap by squeezing depending on the size of the original gap, the island is increased in the longitudinal and horizontal directions.

Since the suspension lead 18 for supporting the island 2 is extended from both the ends of the island 2 and arranged at both ends of the island 2, which correspond to right and left sides in FIG. 17, the squeezed portion cannot be formed in the back surface at those portions. The squeezed portions 7b and 7c and the squeezed portions 7e and 7f are divided by the suspension lead 18. The outer leads 23 which are slightly exposed to the outside of the semiconductor package are continuous with the inner leads 3.

Figure 18:
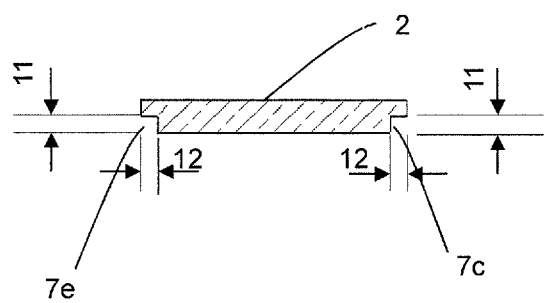
FIG. 18 is a sectional view taken along the line E-E of FIG. 17.

FIG. 18 is a detailed sectional view taken along the cutting line E-E of FIG. 17. The squeezed portions 7c and 7e are each formed in the back surface of the island 2 with the depth 11 and the width 12. The squeeze depth 11 being equal to or larger than a half of the plate thickness can be processed without any problem. When the squeeze depth is set larger, the island size can further be increased. The squeeze width 12 can be set up to equal to the plate thickness T of the lead frame.

Figure 19:
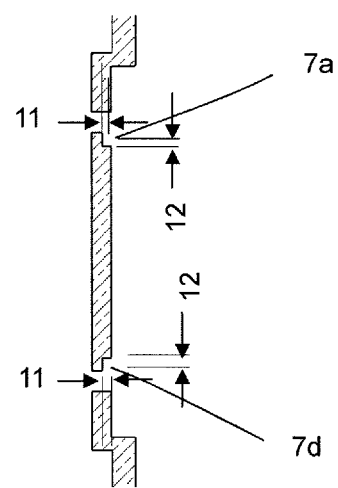
FIG. 19 is a sectional view taken along the line F-F of FIG. 17.

FIG. 19 is a detailed sectional view taken along the cutting line F-F of FIG. 17. The squeezed portions 7a and 7d are each formed in the back surface of the island 2 with the depth 11 and the width 12. The squeeze depth 11 of equal to or larger than a half of the plate thickness can be processed without any problem. When the squeeze depth is set larger, the island size can further be increased. The squeeze width 12 can be set up to equal to the plate thickness T of the lead frame.

The suspension lead 18 is cut after the island 2, the inner leads 3, the semiconductor element (not shown) mounted to the island 2, and the wires (not shown) connecting the semiconductor element and the inner leads are sealed with the sealing resin. The end surface after cutting is thus exposed from the sealing resin.

As described above, the invention of the present application can be carried out regardless of the shape of the package as long as the package is the semiconductor package using the lead frame.

What is claimed is:

1. A manufacturing method for a semiconductor device, the method comprising:
   preparing a lead frame material;
   punching the lead frame material with a stamping press die to manufacture a lead frame, the lead frame having a constant plate thickness and the stamping press having a width equal to or larger than the constant plate thickness, the lead frame comprising:
      an island configured to mount a semiconductor element thereon;
      an inner lead; and
      an outer lead contiguous to the inner lead;
   squeezing a periphery of the island from a back surface of the island after punching to increase an area of the island,
   wherein, after squeezing, a gap between the island and the inner lead is smaller than the constant plate thickness of the lead frame;
   fixing the semiconductor element to a front surface of the island with a die attach material;
   sealing the semiconductor element, the island, and the inner lead with a sealing resin without exposing the back surface of the island; and
   cutting the semiconductor device from the lead frame, the semiconductor device having the outer lead protruding from the sealing resin, and having the semiconductor element, the island, and the inner lead sealed with the sealing resin.

2. The manufacturing method for a semiconductor device according to claim 1, wherein the constant plate thickness of the lead frame is equal to or larger than one-fourth of a thickness of the sealing resin after sealing.

3. The manufacturing method for a semiconductor device according to claim 1, wherein cutting comprises cutting a suspended lead extending from the island.

4. The manufacturing method for a semiconductor device according to claim 1, wherein cutting comprises cutting a suspended lead extending from the island.

* * * * *